United States Patent
Blodgett et al.

(10) Patent No.: US 7,031,652 B2
(45) Date of Patent: Apr. 18, 2006

(54) WIRELESS LOCAL LOOP ANTENNA

(75) Inventors: James R. Blodgett, Walnut Creek, CA (US); Fred Judson Heinzmann, Los Altos, CA (US)

(73) Assignee: SOMA Networks, Inc., San Francisco, CA (US)

( * ) Notice: Subject to any disclaimer, the term of this patent is extended or adjusted under 35 U.S.C. 154(b) by 655 days.

(21) Appl. No.: 09/775,510

(22) Filed: Feb. 5, 2001

(65) Prior Publication Data

US 2003/0013408 A1    Jan. 16, 2003

(51) Int. Cl.
*H04Q 7/20* (2006.01)
*H04Q 7/32* (2006.01)

(52) U.S. Cl. ............... 455/3.01; 455/426.1; 455/426.2; 455/422.1; 455/550.1; 455/557; 455/575.7; 455/556.1; 343/840

(58) Field of Classification Search ............... 455/3.01, 455/550.1, 403, 517, 422.1, 423, 424, 425, 455/67.11, 561, 562.1, 575.1, 88, 575.7, 572, 455/426.1, 426.2, 557, 556.1, 500; 343/840
See application file for complete search history.

(56) References Cited

U.S. PATENT DOCUMENTS

| | | | |
|---|---|---|---|
| 3,109,175 A | 10/1963 | Lloyd | 343/761 |
| 3,560,978 A | 2/1971 | Himmel et al. | 343/106 |
| 3,883,875 A | 5/1975 | McClymont et al. | 343/106 D |
| 4,631,546 A | 12/1986 | Dumas et al. | 343/833 |
| 4,649,393 A * | 3/1987 | Rittenbach | 342/371 |
| 4,700,197 A | 10/1987 | Milne | 343/837 |
| 5,294,939 A | 3/1994 | Sanford et al. | 343/836 |
| 5,488,737 A | 1/1996 | Harbin et al. | 455/33.1 |
| 5,539,419 A * | 7/1996 | Ogawa et al. | 343/761 |
| 5,701,583 A | 12/1997 | Harbin et al. | 455/25 |
| 5,767,807 A | 6/1998 | Pritchett | 342/374 |
| 5,903,826 A | 5/1999 | Nowak | 455/277.1 |
| 5,914,946 A | 6/1999 | Avidor et al. | 370/336 |
| 5,952,966 A | 9/1999 | Smith | 342/373 |
| 6,005,854 A | 12/1999 | Xu et al. | 370/335 |
| 6,034,638 A | 3/2000 | Thiel et al. | 343/702 |

(Continued)

FOREIGN PATENT DOCUMENTS

JP    02-015720    1/1990

(Continued)

*Primary Examiner*—Keith Ferguson
(74) *Attorney, Agent, or Firm*—Katten Muchin Rosenman LLP

(57) ABSTRACT

A wireless local loop system is provided that includes a wireless base station that communicates with a subscriber station via a wireless link. The wireless link can carry a voice service, such as telephone calls, or a data service, such as internet browsing. The subscriber station includes a steerable antenna. A presently preferred steerable antenna for use with the subscriber station includes a driven element mounted on a base plane that is surrounded by a plurality of parasitic elements also mounted to the base plane. The parasitic elements can be optionally grounded or floated in order to reflect the wireless link towards the driven element. The antenna can be oriented in a desired direction during the transception of a voice or data service. A method of transceiving between a wireless local loop subscriber station and a wireless local loop base station is also provided.

52 Claims, 10 Drawing Sheets

U.S. PATENT DOCUMENTS

| | | | |
|---|---|---|---|
| 6,037,905 A | 3/2000 | Koscica et al. | 343/701 |
| 6,100,843 A | 8/2000 | Proctor, Jr. et al. | |
| 6,122,260 A | 9/2000 | Liu et al. | 370/280 |
| 6,124,824 A | 9/2000 | Xu et al. | 342/174 |
| 6,150,987 A | 11/2000 | Sole et al. | 343/757 |
| 6,163,299 A | 12/2000 | Park | 343/700 |
| 6,195,045 B1 | 2/2001 | Xu et al. | 342/368 |
| 6,304,215 B1 | 10/2001 | Proctor, Jr. et al. | |
| 6,351,456 B1 | 2/2002 | Struhsaker et al. | 370/280 |
| 6,496,707 B1 * | 12/2002 | Chu et al. | 455/525 |
| 6,600,456 B1 * | 7/2003 | Gothard et al. | 343/834 |
| 2002/0105471 A1 | 8/2002 | Kojima et al. | 343/749 |

FOREIGN PATENT DOCUMENTS

| | | |
|---|---|---|
| WO | WO 01/30003 A1 | 4/2001 |
| WO | WO 01/35490 A1 | 5/2001 |

* cited by examiner

WIRELESS LOCAL LOOP ANTENNA

FIELD OF THE INVENTION

The present invention relates to telecommunication systems, and more specifically, the present invention relates to a steerable subscriber station antenna for a wireless local loop system.

BACKGROUND OF THE INVENTION

Various forms of modern wireless communications systems are well known. For example, cellular wireless voice services are now widely deployed in industrialized nations, and technology improvements are expected to enhance and expand cellular wireless services and lead to further deployment.

Wireless local loop (WLL) systems are expected to become a viable alternative to the wired local loop telephone services offered by the existing local telephone companies throughout North America. WLL systems typically include a network of wireless base stations, each serving a plurality of subscribers. In turn, each subscriber possesses a subscriber station that supports voice services (e.g. telephone) and/or data services (e.g. internet) using wireless communication with one or more of the base stations.

Attempts have been made to implement WLL systems. In general, these systems have either failed or not enjoyed broad penetration. One system that failed was the IONICA system implemented in United Kingdom. The IONICA system (explained in some detail in the Background of the Invention of U.S. Pat. No. 5,952,966 to Smith) required an antenna mounted to the exterior of the subscriber's premises and connected via a cable to the subscriber station within the subscriber premises. These external antennas needed to be installed by professional installers, often at significant expense, as the IONICA system required the subscriber antenna to be externally mounted and directed towards the base station best suited to service the subscriber.

Such external antennas suffered the additional problem that, as new subscribers and base stations were added, subscribers frequently needed to have their antenna readjusted by professional installers in order to redirect the subscriber's antenna to the new base station, thus increasing the expense of the system and causing frustration to the subscriber as they waited for the professional installer to make the adjustments. It has been suggested that IONICA failed, at least in part, because of the problems associated with unwieldy external antennas. In general, more modern WLL systems still rely on external antennas. For example, the so-called "Project Angel" system promulgated by AT&T uses an external antenna. While these more recent systems have overcome some of the other limitations of IONICA, the need for careful mounting of an external antenna can still be a barrier for some subscribers desiring access to WLL services.

Steerable antennas are also known. For example, U.S. Pat. No. 4,700,197 to Milne teaches an adaptive array antenna that is adapted for use in mobile terminals that communicate with satellite communication systems. One problem with Milne is that it directly contemplates satellite systems, thus Milne teaches away from the of use an adaptive array antenna in a terrestrial-based WLL system. In any event, Milne teaches the use of over a dozen parasitic elements that require complex controls to steer the antenna, and overall adding extra cost and/or complexity to the mobile terminal, thus making it generally unsuitable for use in a WLL system.

U.S. Pat. No. 6,037,905 to Koscica teaches a steerable antenna having a plurality of radiating elements that are comprised of a series of diodes connected in series with conductors having a length that is a fraction of the wavelength of the design frequency. A basic assumption behind this Koscica is that the radiating elements (active or passive) are broken into lengths much smaller than a wavelength in order to make them electrically transparent. However, when this design is applied to common cellular telephone applications or a WLL system, the performance of this antenna would be poor because of the losses due to the plurality of diodes.

U.S. Pat. No. 6,034,638 to Thiel teaches a steerable antenna for use in mobile telephones. Thiel teaches an antenna having four equally spaced monopole elements mounted in a symmetric array on the outer surface of a solid cylinder structure. The cylinder has a high dielectric constant, and extends from a conductive ground plane. The monopole elements can be switched by switching elements so that one or more is active, with the others acting as parasitic directors/reflectors being connected to ground, or left in an open circuit to be effectively transparent. One problem with Thiel is that it is specifically directed to mobile cellular telecommunication systems, and thus teaches away from the application of a steerable antenna in WLL subscriber stations. Further, the mounting of the monopole elements within the solid cylinder structure results in an antenna that may be physically robust for the abuse to which a mobile telephone can be subjected, but is unnecessary and/or overly expensive when applied to a WLL subscriber station. Furthermore, Thiel teaches the switching of the elements in order to reduce the exposure of the subscriber to electromagnetic radiation when the cellular telephone is placed near the subscriber's head, a constraint that is not believed to be of concern in a WLL subscriber station. For example, Thiel teaches the switching of the driven elements, yet it is believed that switching in this manner can cause unacceptable performance loss in a WLL subscriber station. In general, the configuration of the antenna in Thiel and the method of switching the antenna in Thiel are directed to mobile applications, and is thus unsuitable for fixed wireless applications.

SUMMARY OF THE INVENTION

It is an object of the present invention to provide a novel antenna for WLL systems that obviates or mitigates at least one of the above-identified disadvantages of the prior art.

In an aspect of the invention, there is provided a wireless local loop system for carrying at least one subscriber service between a network and a subscriber terminal via a wireless link. The system comprises at least one base station that interconnects the network and the wireless link. The base station is operable to transceive the subscriber service over the link. The subscriber station interconnects the subscriber terminal and the wireless link. The subscriber station includes a steerable antenna that is operable to be oriented in a direction that achieves a desired transception-quality of the subscriber service over the wireless link.

The subscriber service is typically either a voice service (e.g. telephone calls) and/or a data service (e.g. web-browsing or email) but other types of services are within the scope of the invention. By the same token, the network is a network respective to the type of service, such as a public switched telephone network, private switched telephone network and/or a packet switched network.

The subscriber terminal can be any terminal operable to carry the subscriber service(s), such as telephone, computer, intelligent device, personal digital or the like.

The antenna is typically electrically steerable, and includes at least one driven element and a plurality of parasitic elements that are switchable to influence the radio link in relation to the driven element such that the antenna transceives the radio link in the direction.

The tranception-quality can be measured using any suitable metric, such as signal-to-noise ratio, bit error rate, frame error rate, bit rate, power level and frame rate of the wireless link.

The desired transception-quality can be based on the orientation requiring the least emitted power level from the subscriber station.

The steerable antenna can be used simply for an uplink portion of the link, and the subscriber station can include a second steerable antenna used for the downlink portion of the link. In this case, each of the antennas can be independently steerable in different directions according to desired transmission-quality of the uplink and the desired reception-quality of the downlink.

In other embodiments of the invention, other types of steerable antennas can be included that are orientable in both horizontal and vertical planes.

It is contemplated that the present invention is suitable where the downlink between the subscriber station and the base station is subject to multipath interference, resulting in multiple instances of the link each approaching the antenna from different directions and offering different reception-qualities, and whereby the antenna is steerable in the direction that presents the instance of the link with a desired reception-quality. By the same token, the invention is suitable where the transmission of the uplink is subject to multipath interference, and where one direction of transmission offers more desired transmission-quality.

In another aspect of the invention there is provided a method of orienting a steerable antenna in a wireless local loop subscriber station comprising the steps of:
  a. determining an appropriate time to orient the antenna;
  b. illuminating the antenna in a given orientation and measuring a transception-quality of a wireless link in the given orientation;
  c. repeating the illuminating step until a desired number of different orientations have been illuminated; and,
  d. orienting the antenna towards the one of the orientations that has a desired transception-quality.

In another aspect of the invention, there is provided a subscriber station for a wireless local loop system that carries at least one subscriber service between a network and a subscriber terminal. The wireless local loop system includes at least one base station interconnecting the network and a wireless link and the base station is operable to transceive the service over the link. The subscriber station comprises a microprocessor-assembly that interconnects the subscriber terminal and a modem. The microprocessor-assembly is for processing the subscriber service, while the modem is for modulating and demodulating the service. A radio is also connected to the modem and is for converting the service for tranception over the wireless link. A steerable antenna is connected to the radio and is operable to be oriented in a direction that achieves a desired transception-quality of the service over the link.

In another aspect of the invention, there is provided an antenna for a wireless local loop subscriber station comprising a connecting means for attaching the antenna to a radio of the subscriber station. The antenna has at least one driven element for transceiving a subscriber service over a wireless link that is in communication with a wireless base station. The antenna also includes a steering means for orienting the driven element in a direction that achieves a desired tranception-quality of the service over the link.

In a particular aspect, the steering means is electrical.

In a more particular aspect, the steerable antenna further includes a plurality of parasitic elements and the steering means includes at least one switching means, such as a PIN diode, which is attached to each of the parasitic elements to allow the parasitic elements to be switched in order to influence the link in relation to the driven element such that the antenna transceives the link in the selected direction.

In a more particular aspect, the parasitic elements can influence the link by acting as reflectors and/or directors of the link, depending on how the antenna is configured and how the switching means are actuated.

A wireless local loop system is provided that includes a wireless base station that communicates with a subscriber station via a wireless link. The wireless link can carry a voice service, such as telephone calls, or a data service, such as internet browsing. The subscriber station includes a steerable antenna. A presently preferred steerable antenna for use with the subscriber station includes a driven element mounted on a base plane that is surrounded by a plurality of parasitic elements also mounted to the base plane. The parasitic elements can be optionally grounded or floated in order to reflect the wireless link towards the driven element. The antenna can be oriented in a desired direction for the transception of a voice or data service. By allowing the antenna to by dynamically steerable, the varying transception-qualities of the link, (caused by, for example, moving multipath objects) between the subscriber station and the base station can be compensated for in a dynamic fashion. It is believed the present invention can, in certain circumstances, obviate the need for the installation of a directional external antenna connected to the subscriber station, as found in prior art wireless local loop systems.

BRIEF DESCRIPTION OF THE DRAWINGS

Preferred embodiments of the present invention will now be described, by way of example only, with reference to the attached Figures, wherein.

DETAILED DESCRIPTION OF THE INVENTION

Figure 1:
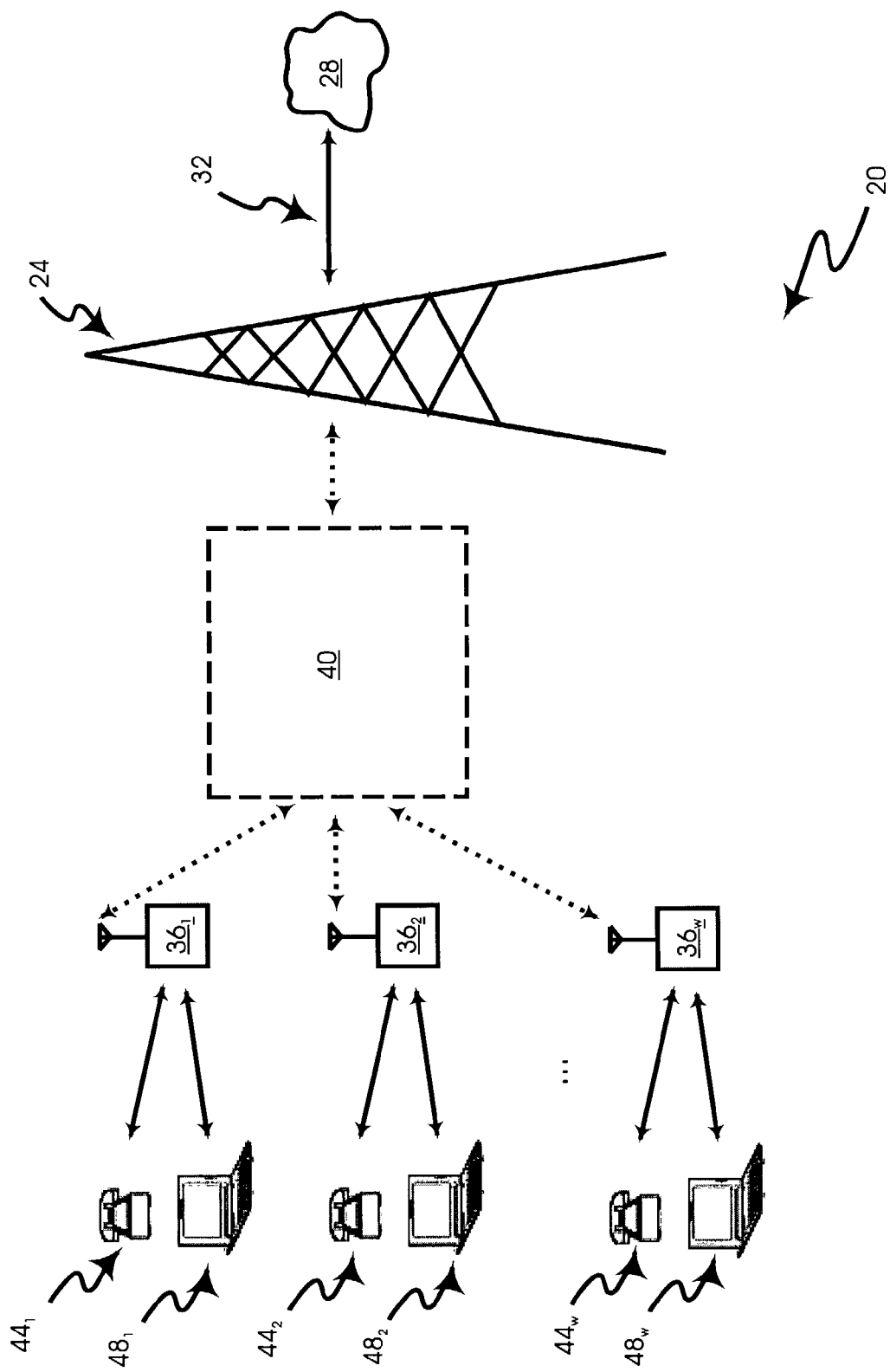
FIG. 1 shows a schematic representation of a wireless local loop system.

Referring now to FIG. 1, a wireless local loop system is indicated generally at 20. System 20 includes a wireless base station 24 that connects, through appropriate gateways (not shown), to a communication network 28 via a backhaul 32. Network 28 is typically the public switched telephone network (PSTN) combined with a packet switched data network, such as the Internet. Backhaul 32 can be any known type of backhaul link between wireless base station 24 and network 28, such as a T1, T3, OC1 or a wireless microwave link.

As will be explained in greater detail below, system 20 can have additional base stations 24, as desired, and that communications between multiple base stations 24 and subscriber stations 36 can be managed using known soft-handoff techniques. Additionally, base station 24 can be multi-sectored, each sector being defined by directional antennas, each sector comprising a different reception footprint.

A wireless link 40, composed of various communications channels, can be established between base station 24 and one or more of a plurality of subscriber stations 36. Utilizing one or more communication channels, wireless link 40 allows information to be transferred between base station 24 and respective subscriber stations 36, as needed. In a present embodiment, the radio-communication protocol employed over wireless link 40 is CDMA, however, other types of protocols, such as GSM, FDMA, OFDM, or TDMA are also within the scope of the invention. The implementation/type of packet communication employed is not particularly limited, and can include IP (with TCP or UDP) and/or modifications thereof or any other packet implementation as will occur to those of skill in the art. While the present embodiment is directed to digitally-based radio communications, it will be understood that the present invention can be modified to accommodate analog based radio communications, such as that found in analog cellular telephone networks.

In a presently preferred embodiment, each subscriber station 36 is fixed within a subscriber's premises. However, it is also contemplated that the present invention can be applicable, with appropriate modifications to mobile and/or nomadic subscriber stations. Each subscriber station 36 is operable to connect to a voice terminal 44 (e.g. a telephone) for conducting voice services, and to connect to a data terminal 48 (e.g. a computer) for conducting data services. It will thus be apparent that each voice terminal 44 and its respective data terminal 48 can be combined into a single intelligent device, such as a wireless telephone with a built-in web browser or any other intelligent device that is operable to process both voice and data. In general, each voice terminal 44 is operable to process voice telephone calls carried over the PSTN portion of network 28, while data terminal 48 is operable to process data applications carried over the packet switched data network portion of network 28. It is to be understood that in other embodiments of the invention, subscriber station 36 and system 20 can be modified to provide different types of services, or to only provide voice or data services.

Figure 2:
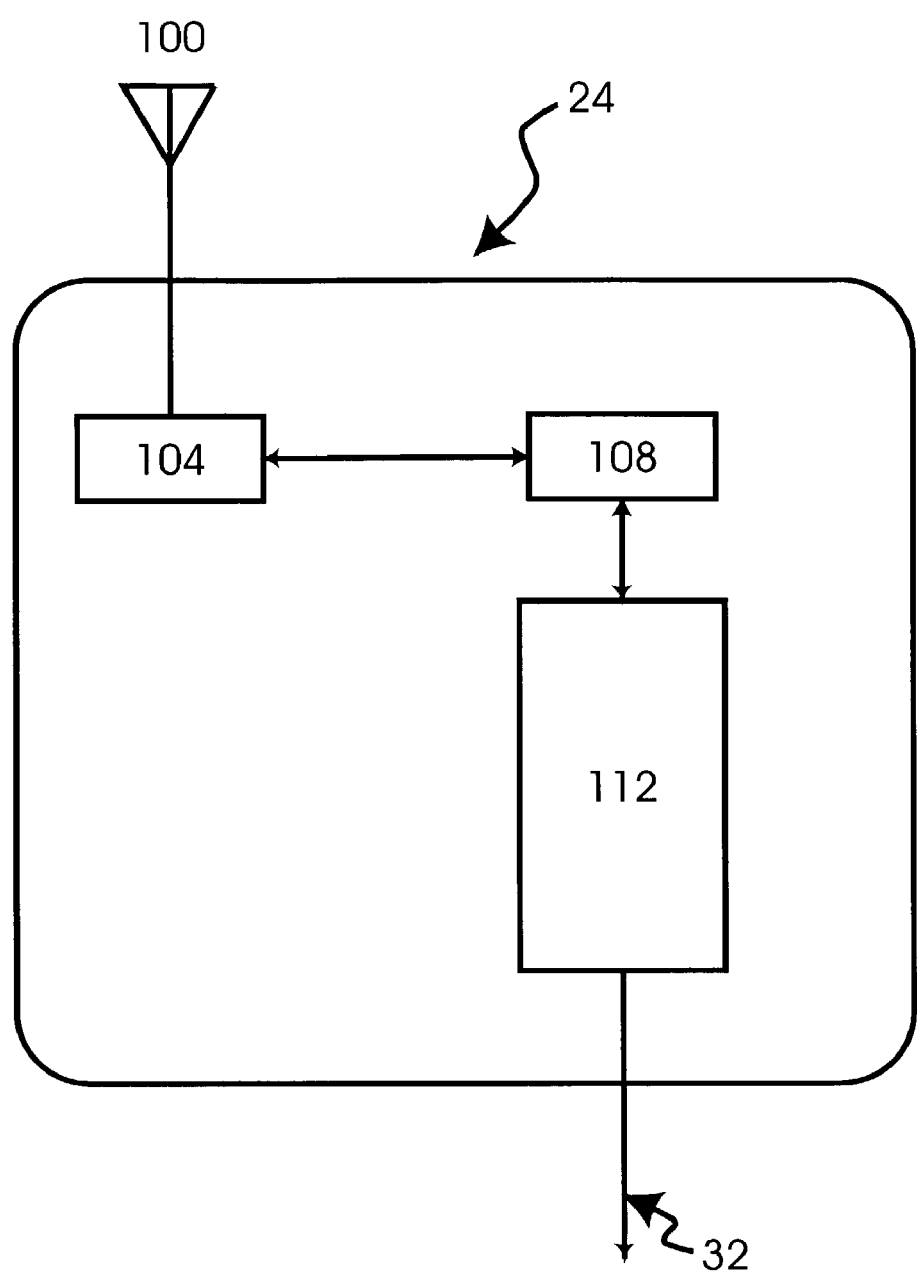
FIG. 2 shows a schematic representation of the base station in the system of FIG. 1.

FIG. 2 shows base station 24 in greater detail. Base station 24 comprises an antenna 100 for receiving and transmitting radio-communications over wireless link 40. In turn, antenna 100 is connected, via any suitable connecting means, to a radio 104 and a modem 108. Modem 108 is connected to a microprocessor-router assembly 112. A suitable microprocessor would be a SPARC processor system manufactured by SUN Microsystems. It will be understood that assembly 112 can include multiple microprocessors, as desired. The router within microprocessor-router assembly 112 is connected to backhaul 32 in any suitable manner, which in turn connects base station 24 to network 28 via appropriate gateways (not shown). Other configurations of base station 24 will occur to those of skill in the art.

Figure 3:
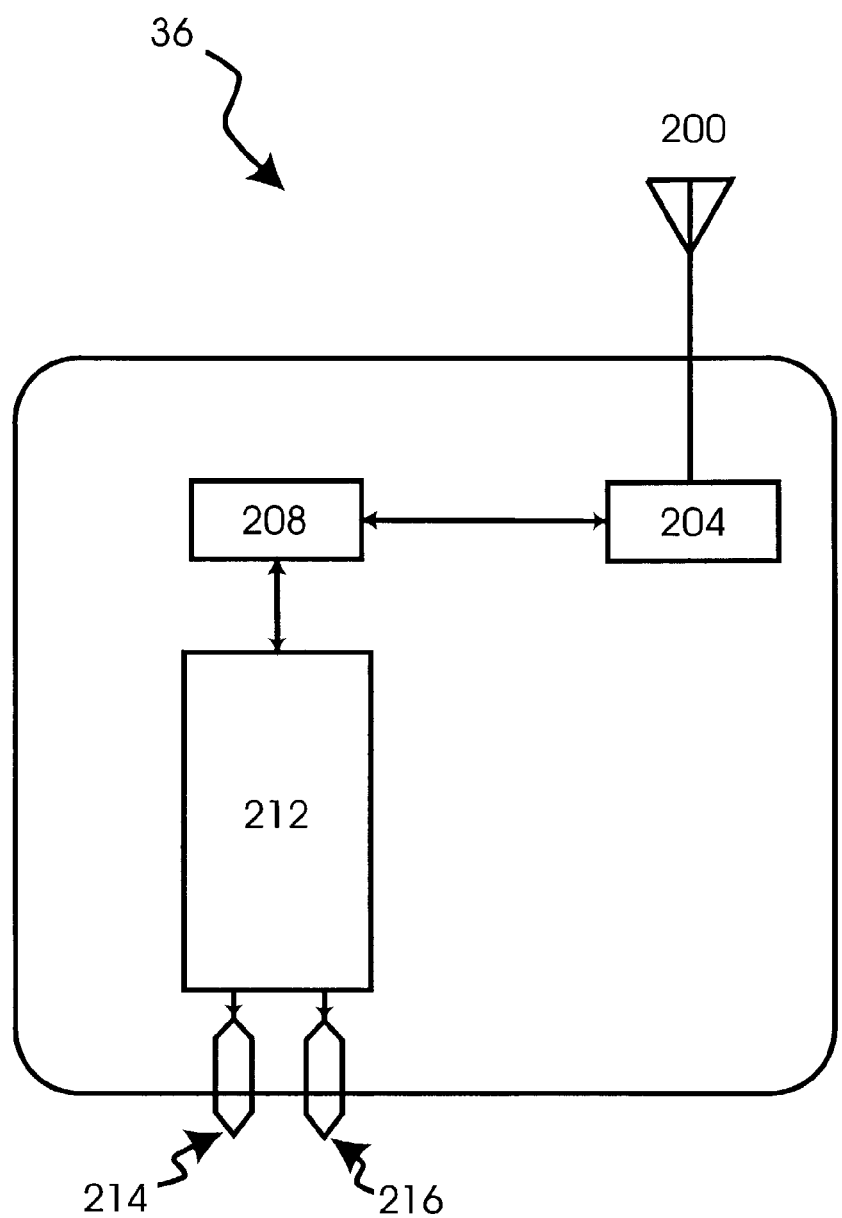
FIG. 3 shows a schematic representation of one of the subscriber stations shown in the system of FIG. 1.

Referring now to FIG. 3, subscriber station 36 is shown in greater detail. Subscriber station 36 comprises a steerable antenna 200 for receiving and transmitting radio-communications over wireless link 40. In turn, antenna 200 is connected to a radio 204 and a modem 208, which in turn is connected to a microprocessor-assembly 212. Typically, antenna 200 is housed within a chassis that also houses the other components of subscriber station 36, making antenna 200 integral with subscriber station 36. For safety reasons, such a housing can be configured to restrict access by the subscriber to the components of subscriber station 36.

Microprocessor-assembly 212 which can include, for example, a StrongARM processor manufactured by Intel, performs a variety of functions, including implementing A/D-D/A conversion, voice codecs, filters, encoders, data compressors and/or decompressors for packet assembly/disassembly. As seen on FIG. 3, microprocessor-assembly 212 interconnects modem 208 and a pair of ports 214, 216. Accordingly, microprocessor-assembly 212 is operable to process voice services for voice terminal 44 (connected to port 214), and data services for data terminal 48 (connected to port 216).

The type of steerable antenna 200 used in association with subscriber station 36 is not particularly limited. However, a presently preferred steerable antenna 200 for use in subscriber station 36 is indicated shown in FIGS. 4 and 5. Steerable antenna 200 comprises a base 250 which supports a center element 254 and a plurality of peripheral elements 258a, 258b, 258c and 258d. In the presently preferred embodiment, antenna 200 is used within the spectrum of from about 1850 Megahertz ("MHz") to about 1990 MHz. More particularly, the frequency range of from about 1850 MHz to about 1910 MHz is reserved for transmitting from subscriber station 36 to base station 24 (i.e. the "uplink" or "forward link") over wireless link 40. Similarly, the frequency range from about 1930 MHz to about 1990 MHz is reserved for receiving transmissions from base station 24 to subscriber station 36 (i.e. the "downlink" or "reverse link") over wireless link 40, with the remaining frequency range of about 1910 MHz to about 1930 MHz serving as a guard-band between the uplink and downlink.

In a present embodiment, base 250 is substantially circular, about eight cm in diameter, and made from any standard printed circuit board material such as FR4, G10 or GTEK. While the presently preferred diameter of base 250 is about eight cm, the diameter of base 250 can be varied, as desired and suitable for operation of antenna 200. Center element 254 depends substantially perpendicularly from the center of base 250.

Center element 254 is characterized by a substantially cylindrical outer sleeve 262 and an inner post 268 that is coaxial with sleeve 262. Sleeve 262 acts as a parasitic element and accordingly, is not connected to radio 204, but instead is connected to ground. Sleeve 262 is made from any conducting material suitable for antenna applications, such as brass or copper. In the present embodiment, sleeve 262 is about 290 mm in length to complement with the above-mentioned frequency range of about 1850 MHz to about 1990 MHz. Inner post 268 acts as the driven element of antenna 200, and accordingly, is connected to radio 204.

Inner post 268 is solid and also made from a conducting material suitable for antenna applications. Inner post 268 is about 425 mm in length. Post 268 and sleeve 262 collectively appear, electrically with respect to wireless link 40, as being one-quarter wavelength long of the freespace propagating wave at the center of the above-mentioned frequency range.

The inventors have determined that, while sleeve 262 is not necessary for the operation of antenna 200, the performance of antenna 200 is generally improved by the presence of sleeve 262, as impedance match at the edges of the frequency range are generally improved thereby. Thus, where sleeve 262 is excluded from center element 254, then inner post 268 is preferably about 400 mm in length in order to appear, electrically with respect to wireless link 40, as being about one-quarter wavelength long, and thereby operate within the frequency range from about 1850 MHz to about 1990 MHz.

A plurality of peripheral elements 258 depends substantially perpendicularly from the periphery of base 250, and parallel to center element 254. In a present embodiment, there are four peripheral elements 258a, 258b, 258c and 258d. Each element 258 is placed at an angle of about ninety degrees from adjacent elements 248 and with respect to center element 254, thereby dividing antenna 200 into four sectors. It will be understood that any number of peripheral elements 258 can be provided to provide a desired number of sectors. In the present embodiment, each element 258 is mounted about 254 mm from the inner post 262. Each element 258 is sized to be electrically, with respect to wireless link 40, about one-quarter wavelength in length. Peripheral elements 258 are independently switchable using any switching means, but typically through the use of a PIN diode connected between ground and each element 258. Such diodes are typically mounted on the side of base 250 opposite from the view shown in FIG. 4, and accordingly are not shown in the attached Figures. Thus, the exact length of element 258 may be chosen to account for the presence of each diode, in order to keep each element 258 electrically about one-quarter wavelength in length. Accordingly, each element 258 is switchable between a grounded state and a floating state. When grounded, an element 258 is said to be switched-in, and thus influencing link 40 by being electrically reflective of wireless link 40 in relation to center element 254. When floating, an element 258 electrically disappears from antenna 200, and thus does not appear electrically with respect to wireless link 40.

Each of the switching means can be controlled using any processing means, such as by microprocessor-assembly 212 which can be operably connected to each switching means. Further, the processing means can be programmed with a set of operating instructions that can be used to determine how antenna 200 should be oriented. An exemplary set of programming instructions will be discussed in greater detail below.

Figure 6:
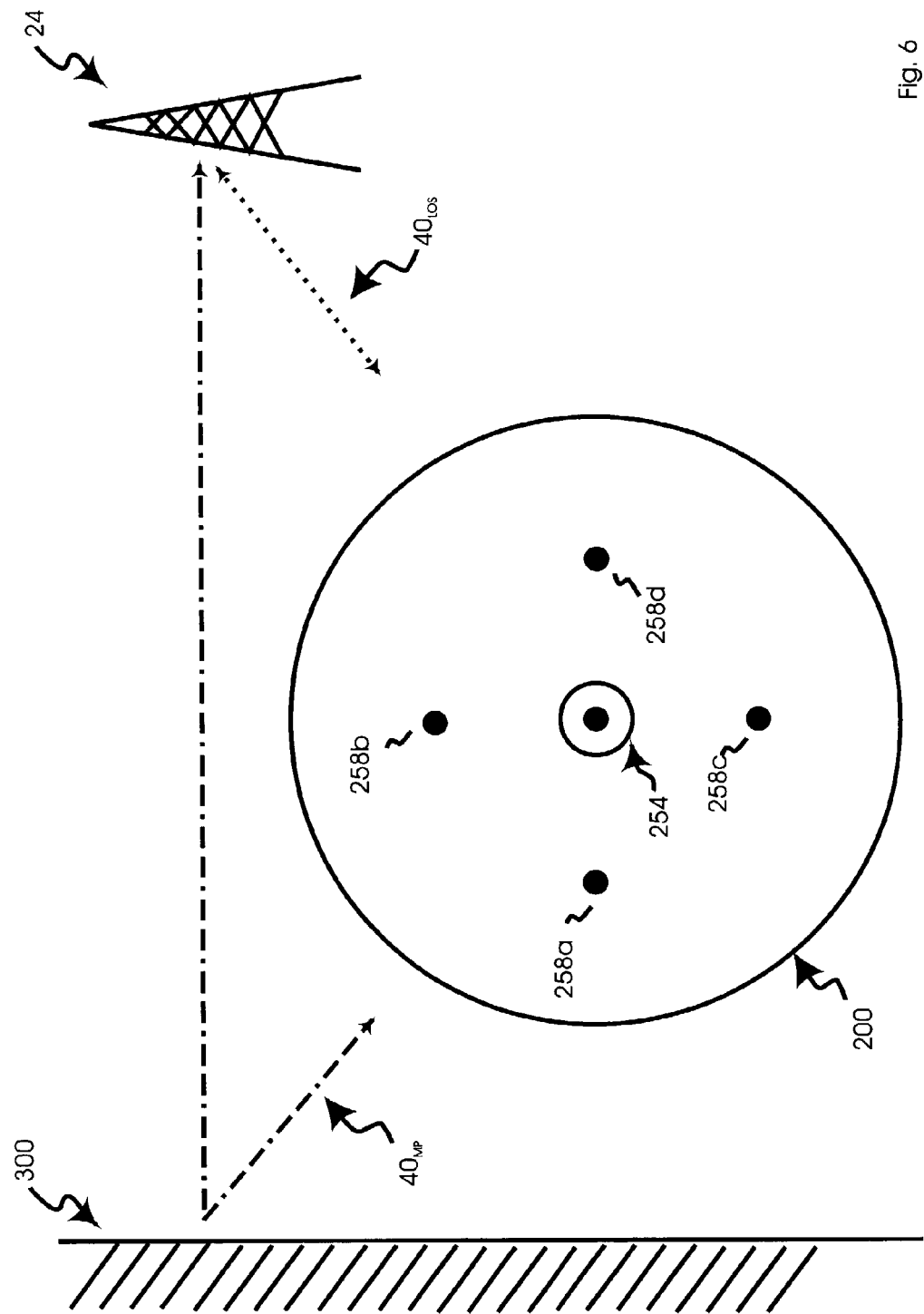
FIG. 6 shows a top view of the antenna of FIG. 4 shown between the base station of FIG. 1 and a multipath object.

Referring to now to FIG. 6, antenna 200 is shown intermediate base station 24, and a multipath object 300. As seen in FIG. 6, base station 24 is transceiving wireless link 40. (As used herein, the term transceiving means transmitting and/or receiving.) However, in contrast to FIG. 1, due to multipath object 300 wireless link 40 actually exists as two wireless links, $40_{LOS}$ and $40_{MP}$. Thus, wireless link $40_{LOS}$ is a line-of-site instance of wireless link 40 between base station 24 and antenna 200, while wireless link $40_{MP}$ is a multipath instance of wireless link 40 between base station 24 and antenna 200. Multipath object 300 can be any object that causes multipath interference signals to exist between base station 24 and antenna 200, such as trees, rocks, buildings, walls and/or can be mobile objects such as trucks or other vehicles. Where multipath object 300 is mobile, it will be understood that wireless link $40_{MP}$ can change depending on the location of object 300. Additionally, it will be understood that FIG. 6 is a simplified example of links, $40_{LOS}$ and $40_{MP}$ and that more complex, and multiple multipath links $40_{MP}$ can exist between base station 24 and steerable antenna 200. Further —it will be also understood that subscriber station 36 can be positioned in relation to base station 24 such that no line-of-site link $40_{LOS}$ instance is available to subscriber station 36, and that in such cases only one or more multipath links $40_{MP}$ may be available to subscriber station 36. As will be explained in greater detail below, antenna 200 is operable to be oriented in a direction of having a desired transception-quality of a service over available links 40 such as the two links $40_{LOS}$ and $40_{MP}$ shown in FIG. 6.

Figure 7:
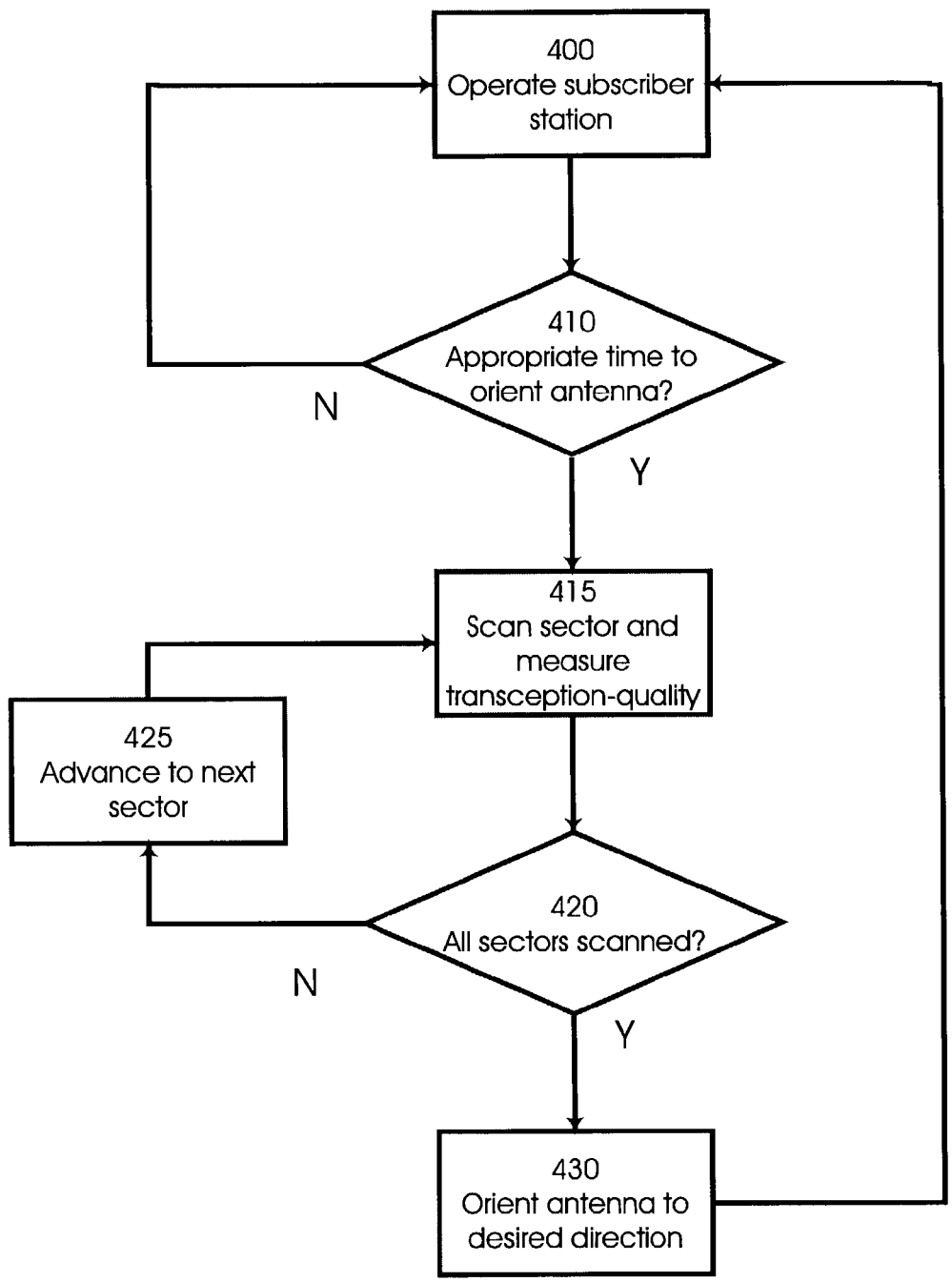
FIG. 7 shows flowchart showing a method for operating the antenna of FIG. 4.

In accordance with another embodiment of the invention, a method for operating a steerable antenna in a WLL system will now be discussed with reference to the flowchart shown in FIG. 7. In order to assist in the explanation of the method, additional reference will be made to the foregoing FIGS. 1–6 and discussion of antenna 200. Beginning at step 400, subscriber station 36 is operated normally. Normal operation can include any number of states. For example, normal operation can be where subscriber station 36 is powered-on, and conducting an initialization sequence of loading operating system software and performing self-diagnostics, and preparing to attempt to establish communications with base station 24 over wireless link 40 using pilot channels or other signaling channels transmitted from base station 24 to subscriber station 36.

Another example of normal operation is where subscriber station 36 has already established communications with base station 24 over wireless link 40, subscriber station 36 may be carrying one or more voice telephone calls between voice terminal 44 and base station 24. Similarly, subscriber station 36 may be carrying one or more data services, (i.e. web-browsing, email) between data terminal 48 and base station 24.

Another example of normal operation is subscriber station 36 may already have established communications with base station 24 over wireless link 40, but be in an idle state where it is not carrying any service.

In the latter three examples of normal operation, it will be understood that antenna 200 will already be oriented in one particular direction towards base station 24. While presently less preferred, it is also contemplated that it can be desired in certain situations to allow antenna 200 to function omni-directionally by floating all peripheral elements 258. Other examples of normal operation of subscriber station 36 will occur to those of skill in the art.

The method then advances to step 410, where it is determined whether an appropriate time has been reached in which to orient (or reorient) antenna 200. This determination can be made based on any number of criteria, which would generally reflect the state of normal operation of subscriber station 36 at step 400 just prior to the advancement of the method to step 410. For example, where, at step 400, subscriber station 36 is attempting to establish initial communications with base station 24, then at a predetermined point during such initialization the determination at step 410 will typically determine that 'yes', now is an appropriate time to orient antenna 200, in order to allow subscriber station 36 to acquire a desired signal with base station 24.

In contrast, where, at step 400, subscriber station 36 is engaged in a voice telephone call using voice terminal 44, it is generally believed that this would be an inappropriate time to reorient the antenna from an existing orientation, due to the risk of dropping the voice call. (While presently less preferred, it is to be understood that there can be situations where it may be desired to reorient antenna 200 during a voice call.)

Where, at step 400, subscriber station 36 is carrying a data service between data terminal 48 and base station 24, then at step 410 it may be desired to reorient antenna 200 if the bit-rate (or other metric of transception-quality) has fallen below a certain threshold. For example, where subscriber station 36 has been able to achieve a higher bit-rate when carrying previous data services between data terminal 48 and base station 24, yet at the time the method reaches step 410 this bit-rate has dropped below that higher bit-rate, then it can be desired to reorient antenna 200 in an attempt to increase the bitrate. It is believed during the processing of a data service can be an appropriate time in which to reorient antenna 200, due to the fact that many data services, such as web-browsing and email transfer are latency tolerant, and accordingly the service can be safely, and briefly, interrupted in order to attempt to achieve a higher bit-rate through antenna reorientation.

Similarly, where, at step 400, subscriber station 36 is in an idle state (i.e, where communications with base station 24 have been established and yet no service is active), then subscriber station 36 can, at predetermined time intervals, attempt to reorient itself in relation to wireless link 40 in an attempt to secure a more desirable signal with base station 24, especially where subscriber station 36 is aware of a drop in uplink or downlink bit-rate, signal-to-noise ratio, or other measurement of transception-quality with respect to wireless link 40.

Other criteria for determining, at step 410, whether an appropriate time for orienting (or reorienting) antenna 200 has been reached will occur to those of skill in the art and are within the scope of the invention.

Referring again to FIG. 6, where, at step 410 it is determined that it is not an appropriate time to orient (or reorient) antenna 200, then the method returns back to step 400 where normal operation of subscriber station 36 proceeds. However, if it is determined that an appropriate time has been reached to orient antenna 200, then the method advances to step 415.

Figure 8:
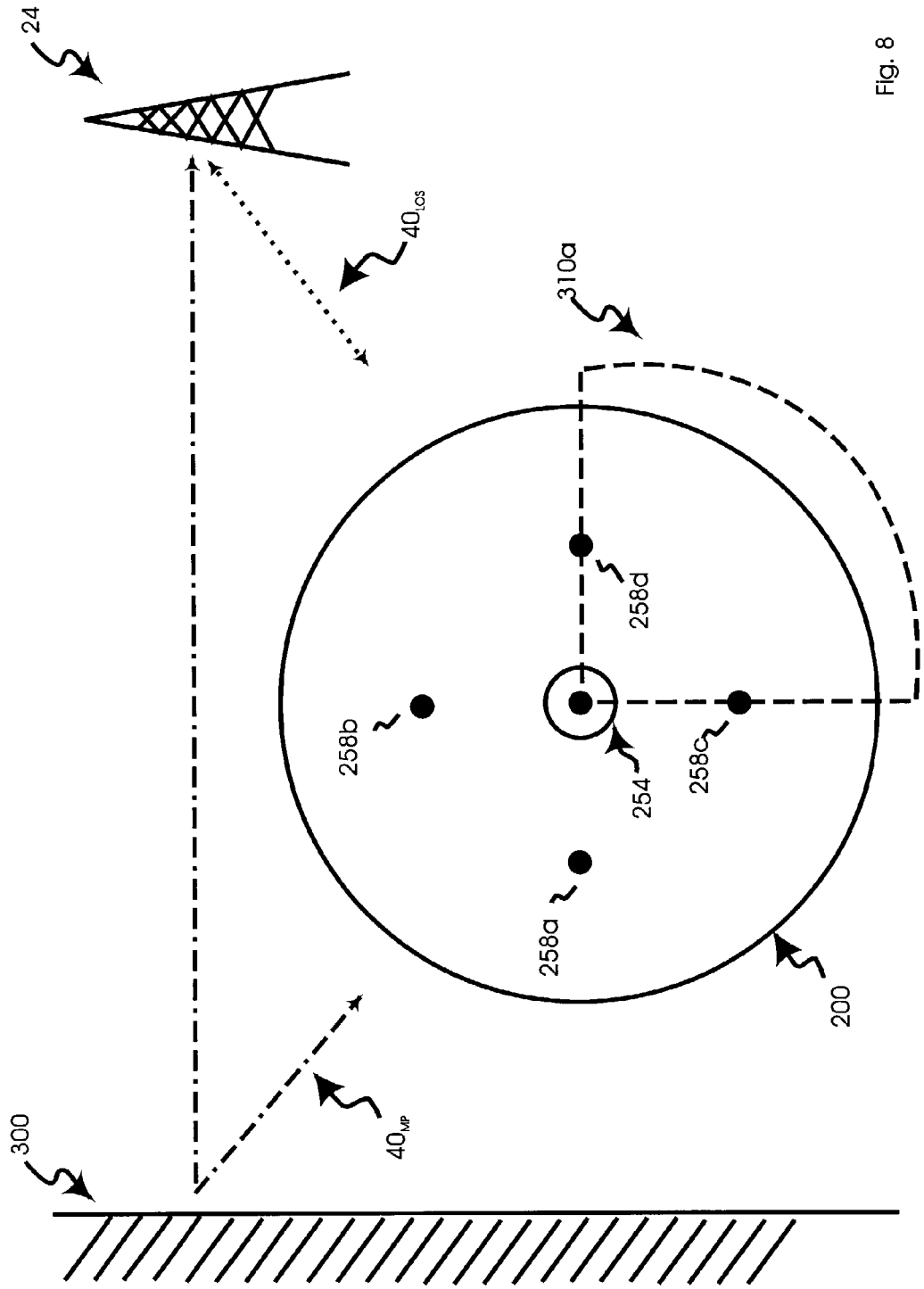
FIG. 8 shows the antenna of FIG. 6 wherein a first of four of the sectors of the antenna is illuminated.

When the method first advances to step 415, an initial (perhaps arbitrarily chosen) sector in which antenna 200 can be directed is scanned and a measurement of transception-quality is taken. In order to explain this step and the subsequent steps, it is useful to explain the method in conjunction with examples shown in FIGS. 8–11. As indicated in FIG. 8, it is assumed that the first sector that is scanned is sector 310a, which lies intermediate peripheral elements 258c and 258d. According to the previously-described configuration of antenna 200, sector 310a is illuminated by placing peripheral elements 258a and 258b (i.e. the elements opposite the illuminated sector 310a) in the grounded state, thereby causing peripheral elements 258a and 258b to act as reflectors, reflecting any downlink signal entering sector 310a towards center element 254, and reflecting any uplink signal from center element 254 which emanates towards elements 258a and 258b outwardly from sector 310a. Similarly, peripheral elements 258c and 258d are placed in the floating state, causing them to be electrically invisible.

Having illuminated sector 310a, the transception-quality of wireless link 40 in sector 310a is measured and stored for later use. Continuing with the example shown in FIG. 8, the measurement of tranception-quality in sector 310a is extremely poor, as neither wireless link $40_{LOS}$ nor wireless link $40_{MP}$ is present in sector 310a.

Any metric for transception-quality can be used. For example, signal-to-noise ratio, emitted power level, bit error rate, frame error rate or combinations thereof in the uplink and/or the downlink of wireless link 40 can be used.

Figure 9:
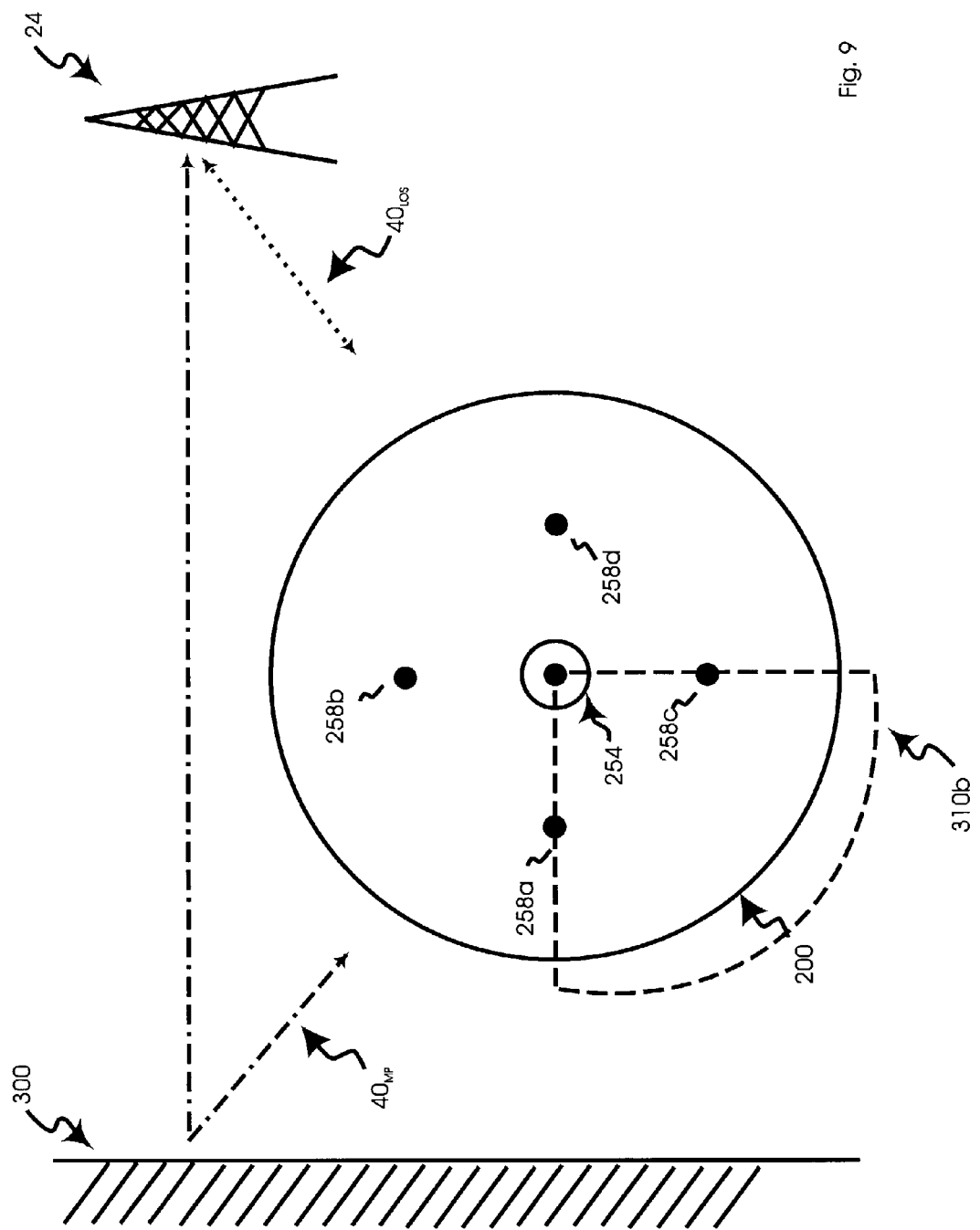
FIG. 9 shows the antenna of FIG. 6 wherein a second of four of the sectors of the antenna is illuminated.

The method then advances to step 420, where it is determined whether all sectors have been scanned. Continuing with the present example, not all of the sectors of antenna 200 have been scanned, and the method moves to step 425 and antenna 200 is advanced to the next sector. This advancement is represented in FIG. 9, where sector 310b is now shown as being illuminated. The illumination of sector 310b is accomplished in a manner which will now be apparent to those of skill in the art, namely, peripheral elements 258b and 258d are placed in the grounded state, causing them to act as reflectors, and elements 258a and 258c are placed in the floating state, causing them to appear electrically invisible.

The method then returns to step 415, at which point the transception-quality of sector 310b is measured and stored for later use. Continuing with the example shown in FIG. 9, the measurement of tranception-quality in sector 310b is extremely poor, as neither wireless link $40_{LOS}$ or wireless link $40_{MP}$ is present in sector 310b.

Figure 10:
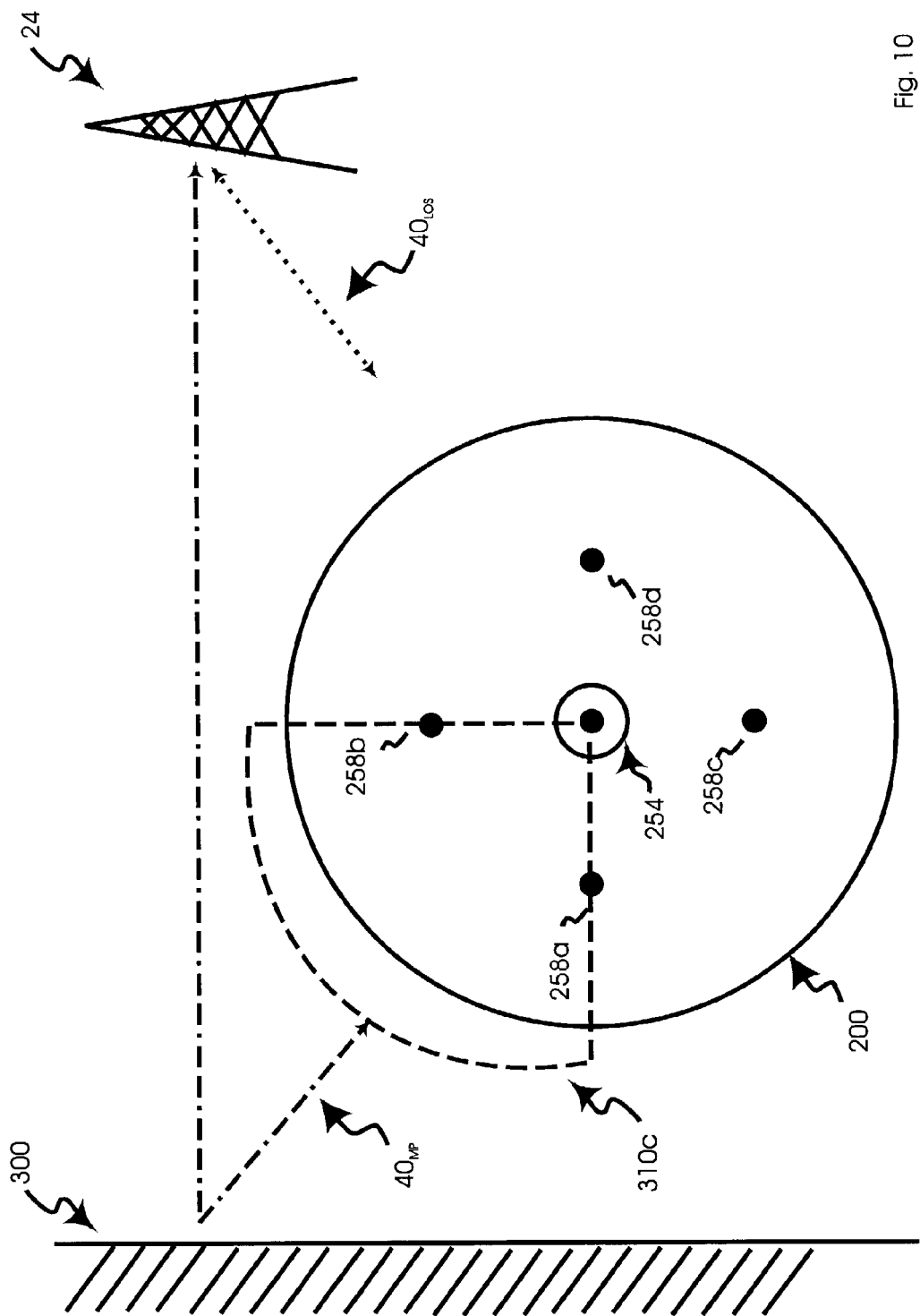
FIG. 10 shows the antenna of FIG. 6 wherein a third of four of the sectors of the antenna is illuminated; and, FIG. 11 shows the antenna of FIG. 6 wherein a fourth of four of the sectors of the antenna is illuminated.

The method then advances again to step 420, where it is determined whether all sectors have been scanned. Continuing with the present example, two of the sectors antenna 200 remain unscanned, and so method moves to step 425 and antenna 200 is advanced to the next sector. This advancement is represented in FIG. 10, where sector 310c is now shown as being illuminated. The illumination of sector 310c is accomplished in a manner which will now be apparent to those of skill in the art, namely, peripheral elements 258c and 258d are placed in the grounded state, causing them to act as reflectors, and elements 258a and 258b are placed in the floating state, causing them to appear electrically invisible.

The method then returns to step 415, at which point the transception-quality of sector 310c is measured and stored for later use. Continuing with the example shown in FIG. 10, the measurement of tranception-quality in sector 310c detects the presence of wireless link $40_{MP}$ in sector 310c. It is to be understood that while wireless link $40_{MP}$ is a multipath instance of wireless link 40, this fact is unknown to subscriber station 36, which simply takes a measurement of link $40_{MP}$ using the desired metric.

Figure 11:
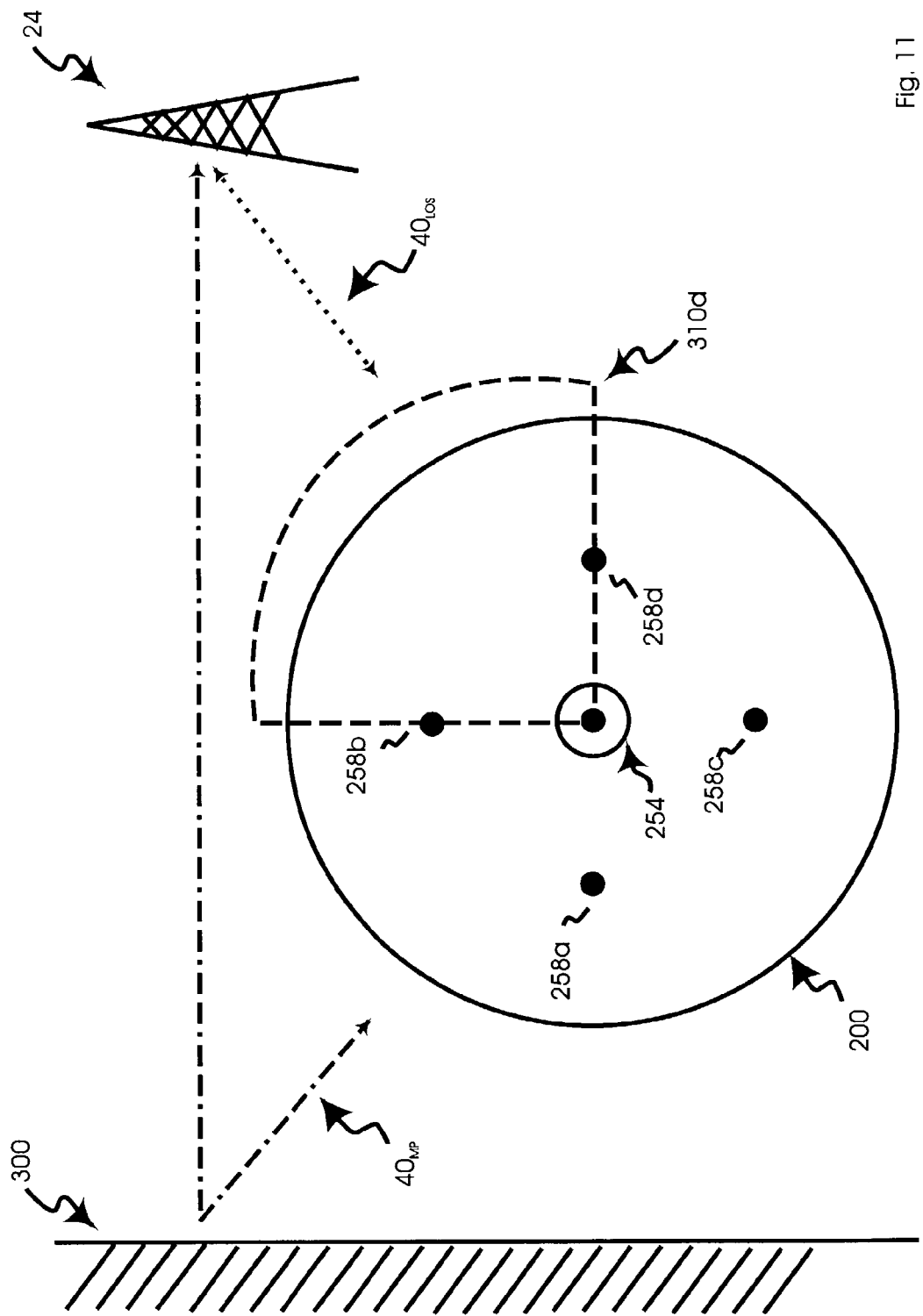

The method then returns again to step 420, where it is determined whether all sectors have been scanned. Continuing with the present example, one of the sectors of antenna 200 remains unscanned, and so method moves to step 425 and antenna 200 is advanced to the next sector. This advancement is represented in FIG. 11, where sector 310d is now shown as being illuminated. The illumination of sector 310d is accomplished in a manner which will now be apparent to those of skill in the art, namely, peripheral elements 258a and 258c are placed in the grounded state, causing them to act as reflectors, and elements 258b and 258d are placed in the floating state, causing them to appear electrically invisible.

The method returns once more to step 415, at which point the transception-quality of sector 310d is measured and stored for later use. Continuing with the example shown in FIG. 11, the measurement of tranception-quality in sector 310c detects the presence of wireless link 40$_{LOS}$ in sector 310d. It is to be understood that while wireless link 40$_{LOS}$ is a line-of-sight instance of wireless link 40, this fact is unknown to subscriber station 36, which simply takes a measurement of link 40$_{MP}$ using the desired metric.

The method then returns again to step 420, where it is determined whether all sectors have been scanned. This time, it is determined that all sectors 310a, 310b, 310c and 310d have been scanned, and accordingly, the method advances to step 430.

At step 430, antenna 200 is oriented in a desired direction. This orientation is made using a selection criteria that considers the transception-quality measurements taken at step 415. The simplest selection criteria is to simply select the sector 310 with the best transception-quality, for example, where the transception-quality is measured in terms of signal-to-noise ratio (SNR), then the sector with the highest SNR will be chosen. According to the examples shown in FIGS. 8–11, it is generally expected that sector 310d, shown in FIG. 11, would have the highest SNR, as sector 310d captures a line-of-sight instance of wireless link 40 (i.e. wireless link 40$_{LOS}$).

However, any selection criteria can be used, and such criteria are expected to be more complex where there are additional multipath objects 300, no line-of-sight link exists, and/or where there are multiple base stations 24 and additional subscriber stations 36 all attempting to carry voice and/or data services. Those of skill in the art will now recognize that, in more complex situations, tranception-quality will vary between the uplink and downlink of wireless link 40. For example, in a CDMA system, one selection criteria for the uplink can be to choose whichever sector 310 (or, in other words, orientation) allows subscriber station 36 to operate at the lowest possible level of transmission power thereby reducing interference with adjacent subscriber stations 36. This criteria can be useful, for example, where subscriber station 36 is simply uploading data to base station 24 over wireless link 40, and not utilizing the downlink of wireless link 40, however, where both the downlink and uplink of wireless link 40 are being utilized, more complex selection criteria can be used to achieve desired operating functionality of system 20.

Having selected the desired sector 310 for antenna 200, the appropriate peripheral elements 258 are placed in the grounded state in order to illuminate that particular sector, thereby orienting antenna 200 in the desired direction. (I.e., in the present example shown in FIG. 11, sector 310d).

At this point, the method returns to step 400, where normal operation of subscriber station 36 resumes. The steps 400–430 thus continuously cycle to reorient antenna 200 in a direction that provides optimal and/or desired operation of subscriber station 36, or until wireless link 40 is broken, terminated by either subscriber station 36, base station 24 or some other multipath object 300 that causes wireless link 40 to break.

Figure 4:
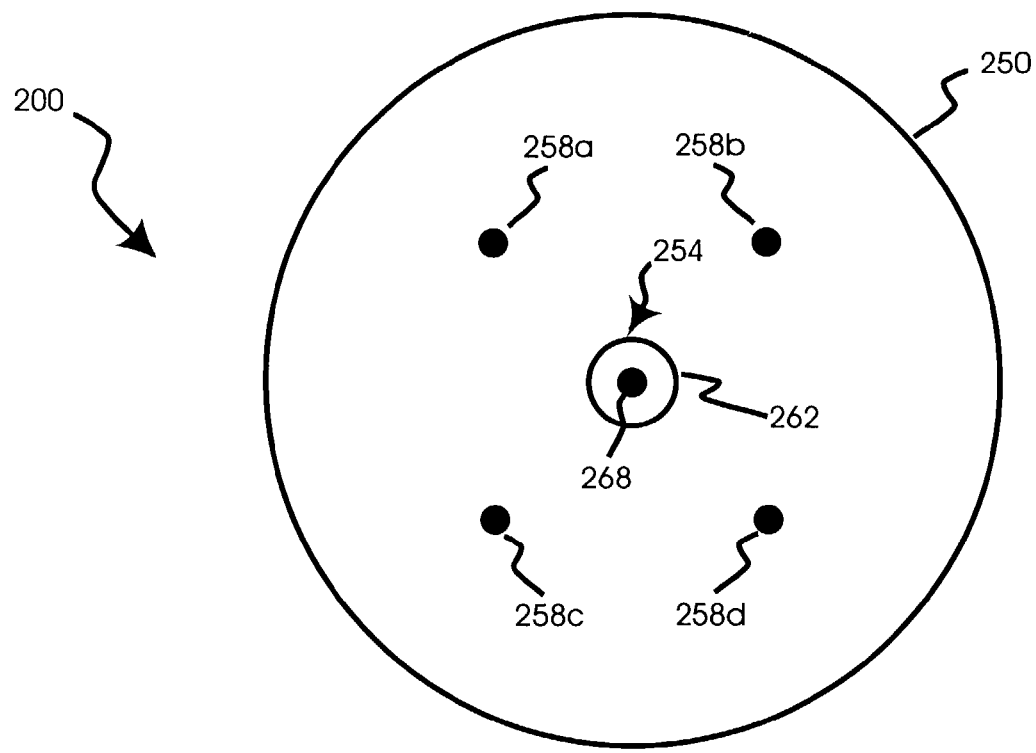
FIG. 4 shows a top view of the antenna in the subscriber station of FIG. 3.
Figure 5:
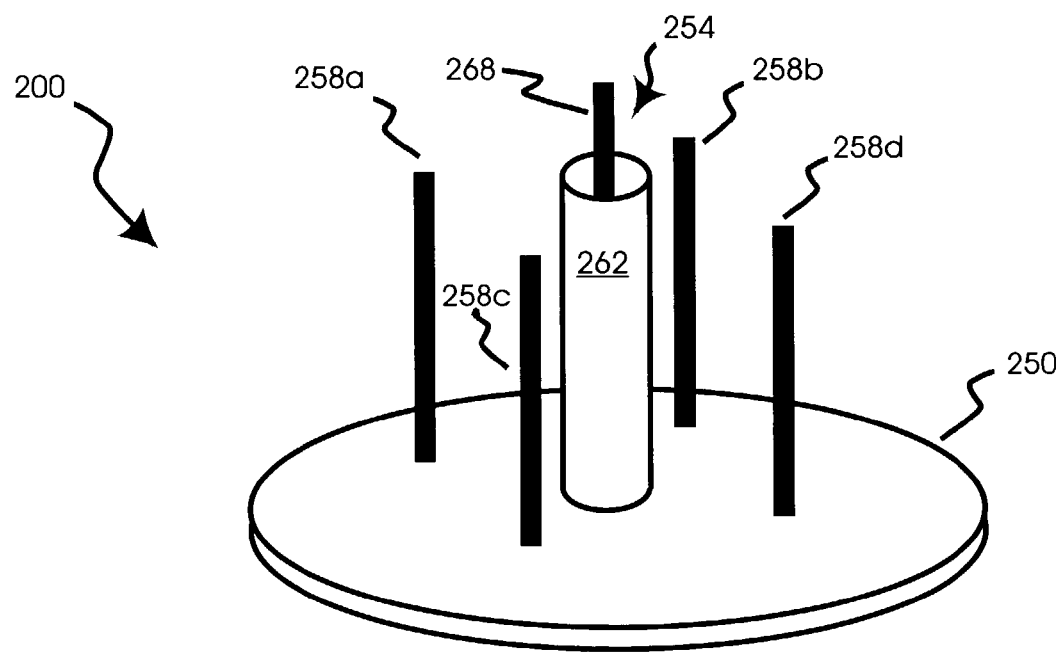
FIG. 5 shows a perspective view of the antenna shown in FIG. 4.

While the embodiments discussed herein are directed to specific implementations of the invention, it will be understood that combinations, sub-sets and variations of the embodiments are within the scope of the invention. For example, while the embodiments shown in FIGS. 4 and 5 are directed to radio communications in the bandwidth from about 1850 MHz to about 1990 MHz, it is to be understood that the embodiments discussed herein can be modified for use in other bandwidths, and such modifications are within the scope of the invention.

Additionally, while antenna 200 in the embodiments discussed herein each have a diode (such as a PIN diode or other suitable switching means) to switch each peripheral element 258 between a grounded state and a floating state, thereby making each element either electrically present or absent, respectively, in other embodiments it may be desired to provide a circuitry which allows intermediate states between present and absent, in order to provide peripheral elements 258 to act as reflectors and/or directors of wireless link 40 in relation to center element 254. In such cases where elements 258 are used as directors and/or reflectors, a switching means is provided that gives the ability to vary the electrical length of each element 258. Such switching can be accomplished by switching inductance into the path of the parasitic element to make it appear electrically longer for use as a reflector, or switching out the inductance to make the element look electrically shorter for use as a director. A suitable switching means in this situation would typically involve the use of two PIN diodes per element 259. Other suitable switching means, suitable for a given application, will occur to those of skill in the art, such as GaA FETs.

While the embodiments discussed above relate to a presently preferred steerable antenna for use with a wireless local loop subscriber station 36, it is to be understood that other types of steerable antennas can be used in conjunction with wireless local loop subscriber station 36, and that such other types are within the scope of the invention. For example, in other embodiments of the invention, the antenna used with subscriber station 36 could have any number and/configuration of reflectors and/or driven elements in order to allow the antenna to be steered and thus allow the antenna to be oriented in a manner that provides desired transception quality. For example, a steerable antenna could be implemented as a fixed, directive antenna with a center element, two reflector elements behind the center element, and two, slightly shorter elements used as director elements in front of the center element. The elements would be attached to the ground plane and the whole assembly can be rotated using a servo motor (or other rotating means) so that the assembly can be oriented in desired direction. As a further example, a yagi-type antenna could be simply mounted on a ground plane and rotated using a servo motor, and the entire assembly incorporated into subscriber station 36.

It is to be understood that other electrically steerable antennas that provide spatial diversity to wireless link 40 can be utilized with subscriber station 36, and that such other electrically steerable antennas are within the scope of the invention. For example a switchable Cartiod pattern electrically steerable antenna can be implemented that involves two elements, placed at one-quarter wavelength apart, and phased with a ninety degree shift. Other types of phasing can be accomplished using monopole elements.

Yet another type of steerable antenna for use with subscriber station 36 can include the use of a plurality of directional antennas, each covering a different sector, whereby each directional antenna can be switched on or off, in order to obtain a desired transception quality for a given sector.

It is also contemplated that the present invention can include multiple steerable antennas incorporated into subscriber station 36. For example, one steerable antenna can be used for transmitting on the uplink, whereas the other antenna can be used for receiving over the downlink, and whereby each antenna can be oriented in different directions according to desired transmission-quality for the uplink, and reception-quality for the downlink.

It is also contemplated that the present invention can be modified to provide a wireless local loop subscriber station with one or more steerable antennas that are steerable in multiple planes: for example, steerable in both horizontal planes and vertical planes, in order to allow the antenna to be directed in both the horizontal and vertical planes to achieve a desired transception-quality.

Furthermore, it is to be understood that where subscriber station 36 is within range of two or more base stations, then the present invention can be used to allow a subscriber station 36 to steer its antenna towards the most desirable signal available from one of those base stations. The foregoing aspect of the invention can be utilized with soft-handoff or other types of handoff techniques.

It is to be understood that two (or more) steerable antennas can be included in a subscriber station 36, where one antenna is dedicated to the uplink and another dedicated to the downlink. In this situation, each antenna can be oriented in different directions and/or towards different base stations, in order to choose the path with the most desirable uplink and downlink data rates, signal-to-noise ratio or other measurements of transmission-quality and reception-quality, respectively.

While the discussion herein is primarily directed to fixed subscriber stations in wireless local loop systems, it will be understood that the present invention can also be applied to nomadic or mobile subscriber stations in more traditional wireless telephony and/or internet systems.

The present invention provides a novel antenna for a wireless local loop system. The present invention provides a compact, cost effective, electrically steerable antenna that adds spatial diversity to a radio link between a base station and a subscriber station in a wireless local loop. The antenna is integral with the subscriber station, and therefore no external antenna is required, nor is there a requirement for the professional installation of such an external antenna, as is commonly found in existing wireless local loop systems. Furthermore, the present invention obviates the need for professional remounting of the antenna when new base stations are added to the wireless local loop system, or where new structures arise that create unacceptable multipath interference. Additionally, since the direction of the antenna can be dynamically changed, the present invention allows for redirecting of the antenna according to changing system requirements. For example, where a first direction of the antenna affords superior bit rate transmission than a second direction that affords superior bit rate reception than the first direction, then the antenna can be changed between these two directions according to whether the subscriber stations is predominantly engaged in uplink transmission or downlink reception. Furthermore, where the use of an omnidirectional antenna can be placed in a location subject to destructive interference from multipath signals, the present invention allows the antenna to be reoriented so as to minimize the effects of the destructive interference. Furthermore, the use of two steerable antennas, one for transmission and one for reception, as taught in certain embodiments of the invention, can allow for each antenna to be oriented in different directions in order to achieve desired transmission-qualities and reception-qualities, respectively.

The above-described embodiments of the invention are intended to be examples of the present invention and alterations and modifications may be effected thereto, by those of skill in the art, without departing from the scope of the invention which is defined solely by the claims appended hereto.

We claim:

1. A wireless local loop system for carrying at least one subscriber service between a network and a subscriber terminal via a wireless link, said system comprising:
   at least one base station interconnecting said network and said wireless link, said base station operable to transceive said service over said link; and
   a subscriber station within said wireless local loop system interconnecting said subscriber terminal and said wireless link, said subscriber station having a steerable antenna that is operable to be oriented in a direction having a desired transception-quality of said service over said link by determining an appropriate time to orient said antenna, illuminating said steerable antenna in a given orientation and measuring the transception-quality of a wireless link in said given orientation, repeating said illuminating step until a desired number of orientations have been illuminated, and orienting said antenna towards the one said orientation that has the desired transception-quality for a subscriber service transmitted over said link.

2. The wireless local loop system of claim 1 wherein said subscriber service includes a voice service, said subscriber terminal is a voice terminal and said network includes the public switched telephone network.

3. The wireless local loop system of claim 1 wherein said subscriber service includes a data service, said subscriber terminal is a data terminal and said network includes the internet.

4. The wireless local loop system of claim 1 wherein said wireless link is based on CDMA.

5. The wireless local loop system of claim 1 wherein said steerable antenna is electrically steerable.

6. The wireless local loop system of claim 5 wherein said steerable antenna includes at least one driven element and a plurality of parasitic elements that are switchable to influence said radio link in relation to said driven element such that said antenna transceives said radio link in said direction.

7. The wireless local loop system of claim 6 wherein said steerable antenna includes one driven element and four parasitic elements peripheral to said driven element and spaced at an angle of about ninety degrees to each other.

8. The wireless local loop system of claim 7 wherein said parasitic elements are each switchable between a grounded state for reflecting said link in relation to said driven element and a floating state for appearing invisible in relation to said radio link.

9. The wireless local loop system of claim 6 wherein said steerable antenna further includes at least one director element that is switchable in order to further influence said radio link in relation to said driven element such that said antenna transceives said radio link in said direction.

10. The wireless local loop system of claim 1 wherein said subscriber service is fixed within said subscriber's premises.

11. The wireless local loop system of claim 1 wherein said transception-quality is measured using at least one of the metrics of signal-to-noise ratio, bit error rate, frame error rate, bit rate, power level and frame rate of said link.

12. The wireless local loop system of claim 1 wherein said desired transception-quality is based on an orientation of said antenna requiring a lowest emitted power level from said subscriber station.

13. The wireless local loop system of claim 1 wherein said steerable antenna is used for an uplink portion of said link and said subscriber station includes a second steerable antenna used for a downlink portion of said link, each of said antennas being independently steerable in different directions according to a desired transmission-quality of said uplink and a desired reception-quality of said down link.

14. The wireless local loop system of claim 1 wherein said subscriber station includes at least one steerable antenna orientable in both horizontal and vertical planes.

15. A method of orienting a steerable antenna in a wireless local loop subscriber station comprising the steps of:
   a. determining an appropriate time to orient said antenna within a wireless local loop system;
   b. illuminating said steerable antenna in a given orientation and measuring a transception-quality of a wireless link in said given orientation;
   c. repeating said illuminating step until a desired number of orientations have been illuminated; and,
   d. orienting said antenna towards the one said orientation that has a desired transception-quality for a subscriber service transmitted over said link.

16. The method according to claim 15 wherein each said orientation is a sector of a circle.

17. The method according to claim 15 wherein said desired number of orientations is the entire number of orientations in which said steerable antenna can be oriented.

18. The method according to claim 15 wherein said appropriate time is reached if said subscriber station is initializing communication over said wireless link between said subscriber station and a base station.

19. The method according to claim 18 wherein said appropriate time is reached if said subscriber station is in an idle state.

20. The method according to claim 15 wherein said appropriate time is determined based on a type of service being carried over said link.

21. The method according to claim 19 wherein said appropriate time is reached if said service is a data service that is latency tolerant.

22. The method according to claim 15 wherein said transception-quality is measured with at least one of the metrics of signal-to-noise ratio, bit error rate, frame error rate, bit rate, power level and frame rate of said link.

23. The method according to claim 15 wherein said link is based on CDMA and said desired transception-quality is based on the one of said orientations requiring the least emitted power level from said subscriber station.

24. A subscriber station for a wireless local loop system that carries at least one subscriber service between a network and a subscriber terminal, said system including at least one base station interconnecting said network and a wireless link, said base station operable to transceive said service over said link, said subscriber station comprising:
   a microprocessor-assembly interconnecting said subscriber terminal and a modem within said wireless local loop system, said microprocessor-assembly for processing said subscriber service, said modem for modulating and demodulating said service;
   a radio connected to said modem and for converting said service for transception over said wireless link; and
   a steerable antenna connected to said radio and operable to be oriented in a direction that achieves a desired transception-quality of said service over said link by determining an appropriate time to orient said antenna, illuminating said steerable antenna in a given orientation and measuring the transception-quality of a wireless link in said given orientation, repeating said illuminating step until a desired number of orientations have been illuminated, and orienting said antenna towards the one said orientation that has the desired transception-quality for a subscriber service transmitted over said link.

25. The subscriber station of claim 24 wherein said subscriber service includes a voice service, said subscriber terminal is a voice terminal and said network includes the public switched telephone network.

26. The subscriber station of claim 24 wherein said subscriber service includes a data service, said subscriber terminal is a data terminal and said network includes the internet.

27. The subscriber station of claim 24 wherein said wireless link is based on CDMA.

28. The subscriber station of claim 24 wherein said steerable antenna is electrically steerable.

29. The subscriber station of claim 24 wherein said steerable antenna includes at least one driven element and a plurality of parasitic elements that are switchable to influence said radio link in relation to said driven element such that said antenna transceives said radio link in said direction.

30. The subscriber station of claim 24 wherein said steerable antenna includes one driven element and four parasitic elements peripheral to said driven element and spaced at an angle of about ninety degrees to each other.

31. The subscriber station of claim 30 wherein said parasitic elements are each switchable between a grounded state for influencing said link in relation to said driven element and a floating state for appearing invisible in relation to said link.

32. The subscriber station of claim 30 wherein said subscriber service is fixed within said subscriber's premises.

33. The subscriber station of claim 30 wherein said transception-quality is measured using at least one of the metrics of signal-to-noise ratio, bit error rate, frame error rate, bit rate, power level and frame rate of said link.

34. The subscriber station of claim 24 wherein said desired transception-quality is based on the orientation requiring the least emitted power level from said subscriber station.

35. The subscriber station of claim 24 wherein said steerable antenna is used for an uplink portion of said link and subscriber station includes a second steerable antenna used for a downlink portion of said link, each of said antennas being independently steerable in different directions according to desired reception-quality of said downlink and desired transmission-quality of said uplink.

36. The subscriber station of claim 24 wherein said subscriber station includes at least one steerable antenna orientable in both horizontal and vertical planes.

37. The subscriber station of claim 24 wherein said link between said subscriber station and said base station is subject to multipath interference.

38. An antenna for a wireless local loop subscriber station comprising:
   a connecting means for attaching said antenna to a radio of said subscriber station;
   at least one driven element for transceiving a subscriber service over a wireless link in communication with a base station in a wireless local loop system; and,
   a steering means for orienting said driven element in a direction that achieves a desired transception-quality of said service over said link by determining an appropriate time to orient said antenna, illuminating said steerable antenna in a given orientation and measuring the transception-quality of a wireless link in said given orientation, repeating said illuminating step until a desired number of orientations have been illuminated, and orienting said antenna towards the one said orientation that has the desired transception-quality for a subscriber service transmitted over said link.

39. The antenna according to claim 38 wherein said subscriber service includes a voice service and said subscriber terminal is a voice terminal.

40. The antenna according to claim 38 wherein said subscriber service includes a data service and said subscriber terminal is a data terminal.

41. The antenna according to claim 38 wherein said wireless link is based on CDMA.

42. The antenna according to claim 38 wherein said steering means is electrical.

43. The antenna according to claim 38 wherein said steerable antenna further includes a plurality of parasitic elements and said steering means includes at least one switching means attached to each of said parasitic elements to allow said parasitic elements to be varied in length in relation to said link in order to influence said link in relation to said driven element such that said antenna transceives said link in said direction.

44. The antenna according to claim 43 wherein said steerable antenna includes one driven element and four parasitic elements peripheral to said driven element and spaced at an angle of about ninety degrees to each other.

45. The antenna according to claim 44 wherein said parasitic elements are each switchable between a grounded state for influencing said link by reflecting said link towards said driven element and a floating state for appearing invisible in relation to said link.

46. The antenna according to claim 44 further comprising a sleeve coaxial with said driven element, said sleeve sized in relation to said driven element and connected to ground such that an impedance match at edges of an operating frequency range of said antenna are improved.

47. The antenna according to claim 38 wherein said subscriber service is fixed within said subscriber's premises.

48. The antenna according to claim 38 wherein said transception-quality is measured in using at least one of the metrics of signal-to-noise ratio, bit error rate, frame error rate, bit rate, power level and frame rate of said link.

49. The antenna according to claim 38 wherein said desired transception-quality is based on the orientation requiring the least emitted power level from said subscriber station.

50. The antenna according to claim 38 wherein said steerable antenna is used for an uplink portion of said link.

51. The antenna according to claim 38 wherein said steerable antenna is used for a downlink portion of said link.

52. The antenna according to claim 38 wherein steerable antenna is orientable in both horizontal and vertical planes.

* * * * *